(12) United States Patent
Grill et al.

(10) Patent No.: US 6,737,725 B2
(45) Date of Patent: May 18, 2004

(54) MULTILEVEL INTERCONNECT STRUCTURE CONTAINING AIR GAPS AND METHOD FOR MAKING

(75) Inventors: Alfred Grill, White Plains, NY (US); Jeffrey Curtis Hedrick, Montvale, NJ (US); Christopher Vincent Jahnes, Upper Saddle River, NJ (US); Satyanarayana Venkata Nitta, Fishkill, NY (US); Kevin S. Petrarca, Newburgh, NY (US); Sampath Purushothaman, Yorktown Heights, NY (US); Katherine Lynn Saenger, Ossining, NY (US); Stanley Joseph Whitehair, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/144,574

(22) Filed: May 13, 2002

(65) Prior Publication Data
US 2002/0127844 A1 Sep. 12, 2002

Related U.S. Application Data

(62) Division of application No. 09/652,754, filed on Aug. 31, 2000, now Pat. No. 6,413,852.

(51) Int. Cl.⁷ .............................................. H01L 29/00
(52) U.S. Cl. ........................ 257/522; 257/618; 257/758; 257/750; 257/759
(58) Field of Search ........................ 438/411, 622–624, 438/619, 421–422, 637–638; 257/618, 750, 758, 522, 759

(56) References Cited

U.S. PATENT DOCUMENTS

| | | | |
|---|---|---|---|
| 4,074,342 A | 2/1978 | Honn et al. | |
| 4,420,877 A | 12/1983 | McKenzie, Jr. | |
| 5,141,896 A * | 8/1992 | Katoh | 438/619 |
| 5,669,774 A | 9/1997 | Grabbe | |
| 5,936,295 A * | 8/1999 | Havemann et al. | 257/522 |
| 5,945,837 A | 8/1999 | Fredrickson | |
| 5,950,102 A * | 9/1999 | Lee | 438/619 |
| 6,064,118 A * | 5/2000 | Sasaki | 257/758 |
| 6,069,481 A | 5/2000 | Matsumura | |
| 6,071,805 A * | 6/2000 | Liu | 438/619 |
| 6,078,088 A | 6/2000 | Buynoski | |
| 6,090,698 A * | 7/2000 | Lee | 438/619 |
| 6,107,109 A | 8/2000 | Akram et al. | |
| 6,150,232 A * | 11/2000 | Chan et al. | 438/421 |
| 6,159,842 A * | 12/2000 | Chang et al. | 438/622 |
| 6,177,329 B1 * | 1/2001 | Pang | 438/400 |
| 6,252,290 B1 * | 6/2001 | Quek et al. | 257/522 |
| 6,268,262 B1 * | 7/2001 | Loboda | 438/422 |
| 6,284,675 B1 | 9/2001 | Jin et al. | |
| 6,297,125 B1 * | 10/2001 | Nag et al. | 438/421 |
| 6,333,255 B1 * | 12/2001 | Sekiguchi | 438/622 |
| 6,333,556 B1 * | 12/2001 | Juengling et al. | 257/758 |
| 6,388,328 B1 * | 5/2002 | Doyle et al. | 257/758 |
| 2001/0014526 A1 | 8/2001 | Clevenger et al. | |

* cited by examiner

Primary Examiner—Long Pham
Assistant Examiner—Thao X. Le
(74) Attorney, Agent, or Firm—Scully, Scott, Murphy & Presser; Robert M. Trepp, Esq.

(57) ABSTRACT

A method for forming a multilayer interconnect structure on a substrate that include interconnected conductive wiring and vias spaced apart by a combination of solid or gaseous dielectrics. The inventive method includes the steps of: (a) forming a first planar via plus line level pair embedded in a dielectric matrix formed from one or more solid dielectrics and comprising a via level dielectric and a line level dielectric on a substrate, wherein, at least one of said solid dielectrics is at least partially sacrificial; (b) etching back sacrificial portions of said at least partially sacrificial dielectrics are removed to leave cavities extending into and through said via level, while leaving, at least some of the original via level dielectric as a permanent dielectric under said lines; (c) partially filling or overfilling said cavities with a place-holder material which may or may not be sacrificial; (d) planarizing the structure by removing overfill of said place-holder material; (e) repeating, as necessary, steps (a)–(d); (f) forming a dielectric bridge layer over the planar structure; and (g) forming air gaps by at least partially extracting said place-holder material.

12 Claims, 7 Drawing Sheets

MULTILEVEL INTERCONNECT STRUCTURE CONTAINING AIR GAPS AND METHOD FOR MAKING

CROSS REFERENCE TO RELATED APPLICATIONS

This application is a divisional application of U.S. application Ser. No. 09/652,754, filed Aug. 31, 2000, now U.S. Pat. No. 6,413,852. Cross reference is also made to U.S. application Ser. No. 09/374,839, filed Aug. 14, 1999 by Clevenger, et al. entitled "Semi Sacrificial Diamond for Air Dielectric Formation" and to U.S. application Ser. No. 09/112,919, filed Jul. 9, 1998 by T. O. Graham, et al. entitled "A Chip Interconnect Wiring Structure with Low Dielectric Constant Insulator and Methods for Fabricating the Same," both directed towards multilevel interconnect structures on integrated circuit chips incorporating a gaseous dielectric medium in at least one level, confined to within the chip by a dielectric encapsulate.

FIELD OF THE INVENTION

The present invention relates to air gap-containing metal/insulator interconnect structures for Very Large Scale Integrated (VLSI) and Ultra-Large Scale Integrated (ULSI) devices and packaging, and more particularly to structures, methods, and materials relating to the incorporation of air gaps into multiple levels of multilayer interconnect structures.

BACKGROUND OF THE INVENTION

Device interconnections in Very Large Scale Integrated (VLSI) or Ultra-Large Scale Integrated (ULSI) semiconductor chips are typically effected by multilevel interconnect structures containing patterns of metal wiring layers called traces. Wiring structures within a given trace or level of wiring are separated by an intralevel dielectric, while the individual wiring levels are separated from each other by layers of an interlevel dielectric. Conductive vias are formed in the interlevel dielectric to provide interlevel contacts between the wiring traces.

By means of their effects on signal propagation delays, the materials and layout of these interconnect structures can substantially impact chip speed, and thus chip performance. Signal-propagation delays are due to RC time constants wherein 'R' is the resistance of the on-chip wiring, and 'C' is the effective capacitance between the signal lines and the surrounding conductors in the multilevel interconnection stack. RC time constants are reduced by lowering the specific resistance of the wiring material, and by using interlevel and intralevel dielectrics (ILDS) with lower dielectric constants, k.

A preferred metal/dielectric combination for low RC interconnect structures is copper metal with a dielectric such as $SiO_2$ (k~4.0). Due to difficulties in subtractively patterning copper, copper-containing interconnect structures are typically fabricated by a damascene process. In a typical damascene process, metal patterns, which are inset in a layer of dielectric, are formed by the steps of: (i) etching holes (for vias) or trenches (for wiring) into the interlevel or intralevel dielectric; (ii) optionally, lining the holes or trenches with one or more adhesion or diffusion barrier layers; (iii) overfilling the holes or trenches with a metal wiring material; and (iv) removing the metal overfill by a planarizing process such as chemical-mechanical polishing (CMP), leaving the metal even with the upper surface of the dielectric.

The above-mentioned processing steps can be repeated until the desired number of wiring and via levels have been fabricated.

Fabrication of interconnect structures by damascene processing can be substantially simplified by using a process variation known as dual damascene, in which patterned cavities for the wiring level and its underlying via level are filled in with metal in the same deposition step. Dual damascene reduces the number of metal polishing steps by a factor of two, providing substantial cost savings, but requires that a dual-relief pattern be introduced into the combined via+wiring level dielectric.

Low-k alternatives to $SiO_2$ include carbon-based solid materials such as diamond-like carbon (DLC), also known as amorphous hydrogenated carbon (a-C:H), fluorinated DLC (FDLC), SiCO or SiCOH compounds, and organic or inorganic polymer dielectrics. Nanoporous versions of $SiO_2$ and the above-mentioned carbon-based materials have even lower k values, while air gaps have the lowest k values of any material (k~1.00). (Note that the air in the air gap may comprise any gaseous material or vacuum.)

Examples of multilayer interconnect structures incorporating air gaps are described, for example, in U.S. Pat. No. 5,461,003 by Havemann, et al.; U.S. Pat. No. 5,869,880, by Grill, et al.; and U.S. Pat. No. 5,559,055 by Chang, et al.

One preferred prior art method for forming air gaps utilizes a sacrificial place-holder (SPH) material which is removed or extracted from beneath a solid, semi-permeable, or perforated bridge layer. Examples of SPH materials and removal methods include poly (methylmethacrylate) (PMMA), poly-para-xylylene (Parylene™), amorphous carbon, and polystyrene, which may be removed by organic solvents, oxygen ashing, and/or low temperature (~200° C.) oxidation, and norborene-based materials such as BF Goodrich's Unity Sacrificial Polymer™, which may be removed by low temperature (350°–400° C.) thermal decomposition into volatiles. In the case of the Unity™ material, the volatile decomposition by-product actually diffuses through the bridge layer, as demonstrated by Kohl et al., Electrochemical and Solid-State Letters 149 (1998) for structures comprising $SiO_2$ (500 nm) bridge layers deposited by a low temperature plasma enhanced chemical vapor deposition (PECVD) process.

Compared to structures with solid dielectrics, air gap-based structures have lower thermal conductivity, reduced mechanical strength, and higher permeability to moisture and oxygen. Workable schemes for incorporating air gaps into interconnect structures must take these limitations into account. A further concern with air gap dielectrics is that they leave metal wiring features more susceptible to the opens and shorts induced by electromigration-driven mass transport, since the wiring features are no longer dimensionally constrained by being embedded in a solid dielectric.

Another concern is that structures with air gaps may not be as uniformly planar as structures built with intrinsically more rigid solid dielectrics. This can be a problem if locally depressed areas are formed by bridge layer sag over unsupported air gaps, since metal filling these depressed areas will remain in the structure after chemical-mechanical polishing (CMP) and be a source of shorts and/or extra capacitance.

In view of the drawbacks mentioned hereinabove with prior art processes, there is a continued need for developing a new and improved method in which air gaps can be formed in an interconnect without exhibiting any of the above-mentioned problems.

SUMMARY OF THE INVENTION

It is thus a general object of the present invention to provide a multilayer interconnect structure containing air gaps.

It is a further object of the present invention to provide an air gap-containing interconnect structure which is resistant to electromigration failure and environmental corrosion.

Another object of the present invention is to provide an air gap-containing interconnect structure which maximizes air gap volume fraction (relative to total volume fraction of dielectric), while minimizing the amount of unsupported wiring.

A still further object of the present invention is to provide a cost-effective and scalable method for fabricating multi-level interconnect structures having air gaps.

An even further object of the present invention is to, provide a method for-forming air gap-containing interconnect structures which minimizes the amount of processing that air gaps in the structure will experience during the fabrication of the structure.

Another object of the present invention is to provide a method for forming air gap-containing interconnect structures which minimizes the number of extra processing steps associated with (i) extraction of the sacrificial place-holder (SPH) material; and (ii) forming and/or patterning and/or pinching-off bridge layers through which the SPH must be removed.

The present invention provides a multilevel air gap-containing interconnect structure, and a workable, straight-forward method for its fabrication. A preferred embodiment of the inventive structure includes a combination of an "air gap plus solid" via-level dielectric (with the solid dielectric only under the lines) plus a mostly air gap line-level dielectric.

The fabrication method forms planar via plus line level pairs embedded in a dielectric matrix comprising predefined regions of a permanent dielectric and predefined regions of a sacrificial place-holder (SPH) material. A dielectric bridge layer containing holes or perforations is formed on the structure after the desired number of pair levels have been assembled. The SPH in all the levels is then selectively removed through the perforated bridge layer leaving the permanent dielectric behind. Because the SPH removal and air gap formation is done all-at-once, at the end of the structure formation, air gaps in the lower levels of the structure do not have to survive multiple levels of processing. After SPH extraction, the perforations in the bridge layer are then pinched-off by means of an additional dielectric deposition step. In a variation of this first embodiment, additional wiring and via levels not containing air gaps may be built over the air gap-containing structure to form a more complex interconnect structure containing air gaps in its lower line levels and solid dielectric in its upper line levels.

In a second embodiment having much the same process sequence, dielectric sidewall spacers may be formed on the lines and/or vias as each level's dielectric matrix is being formed. While these spacers will increase the structure's effective dielectric constant, $k_{eff}$, benefits are expected in mechanical and electromigration protection, and a reduced probability for arcing. In a third embodiment, the SPH is replaced by an ultra low-k dielectric (e.g., a porous SiLK™ or nanoporous glass) which remains in the structure.

Specifically, the inventive method comprising the steps of:

(a) forming on a substrate a first planar via plus line level pair embedded in a dielectric matrix formed from one or more solid dielectrics and comprising a via level dielectric and a line level dielectric, wherein at least one of said solid dielectrics is at least partially sacrificial;

(b) etching back sacrificial portions of said at least partially sacrificial dielectrics to form cavities extending into and through said via level, while leaving at least some of the original via level dielectric as a permanent dielectric under said lines;

(c) at least partially filling and then overfilling said cavities with a place-holder material which may or may not be sacrificial;

(d) planarizing the structure by removing overfill of said place-holder material;

(e) repeating, as necessary, steps (a)–(d);

(f) forming a dielectric bridge layer over the planar structure; and (g) forming air gaps by at least partially extracting said place-holder material.

BRIEF DESCRIPTION OF THE DRAWINGS

These and other features, objects, and advantages of the present invention will become apparent upon consideration of the following detailed description of the invention when read in conjunction with the drawings, in which.

DESCRIPTION OF THE PREFERRED EMBODIMENTS

The present invention which provides methods of fabricating a multilevel interconnect structure having air gaps therein as well as a multilevel interconnect structure will now be described in more detail by referring to the following description as well as the drawings that accompany the present application.

Figure 1A:
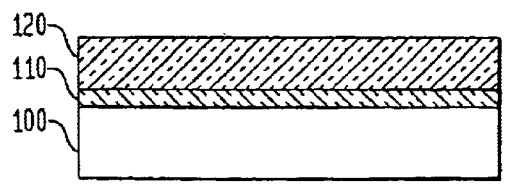
FIGS. 1A–1P show, in cross section view, the basic steps of the instant invention for forming an air gap containing interconnect structure.
Figure 1B:
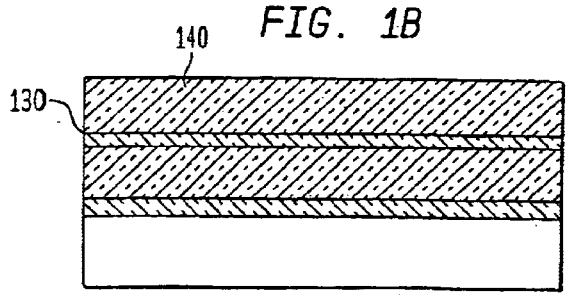
Figure 1C:
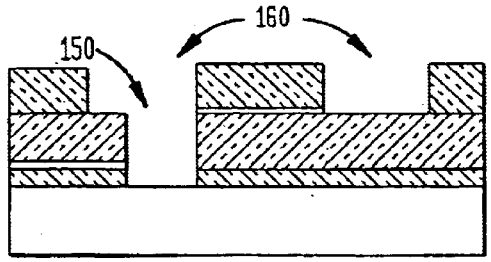
Figure 1D:
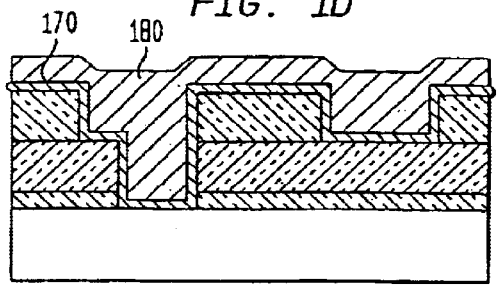
Figure 1E:
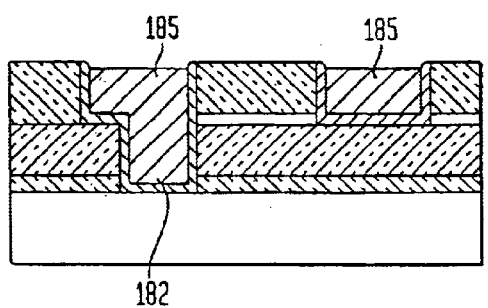
Figure 1F:
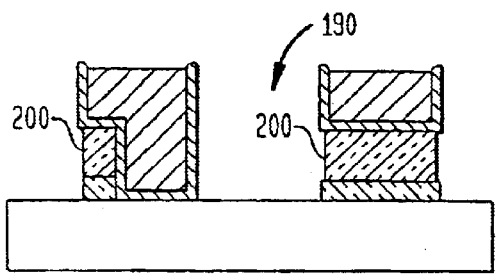
Figure 1G:
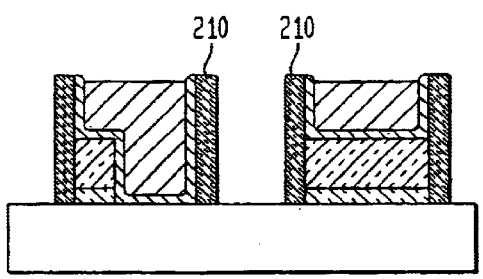
Figure 1H:
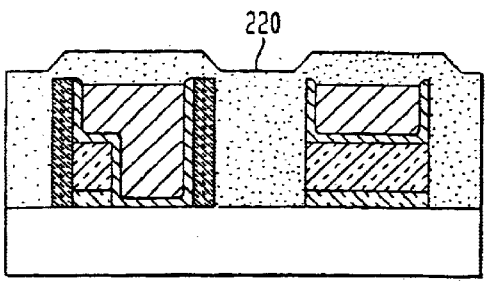
Figure 1I:
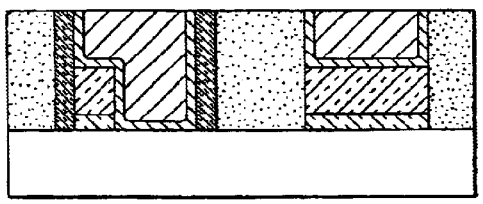
Figure 1J:
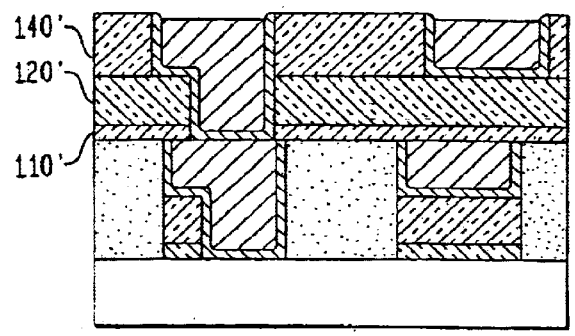
Figure 1K:
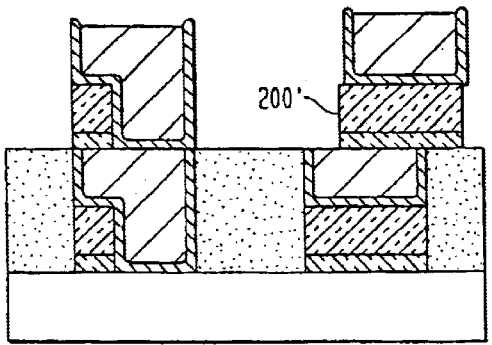
Figure 1L:
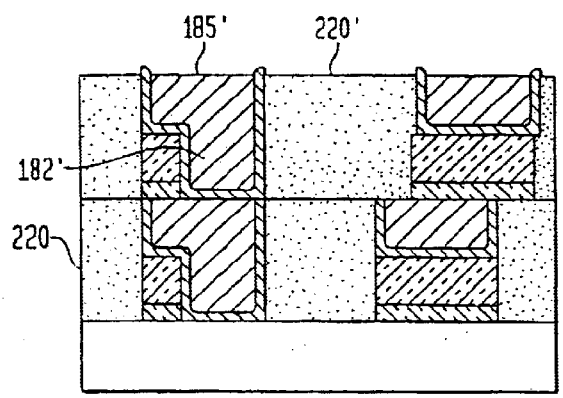
Figure 1M:
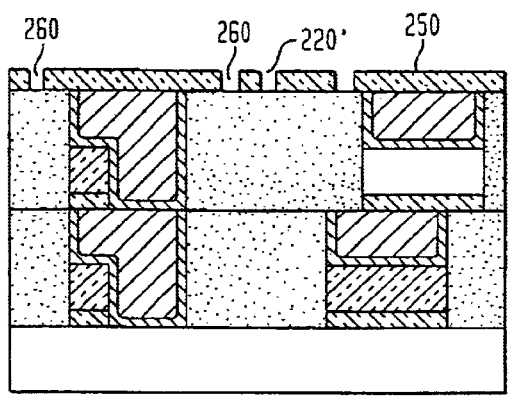
Figure 1N:
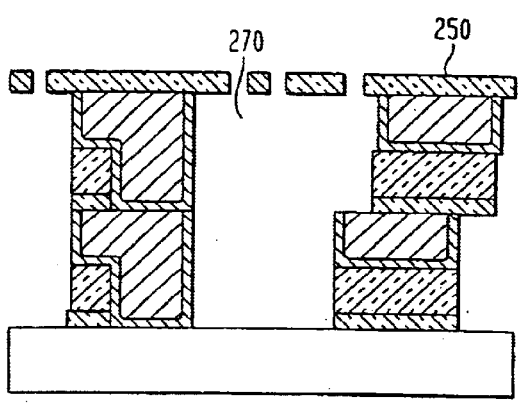
Figure 1O:
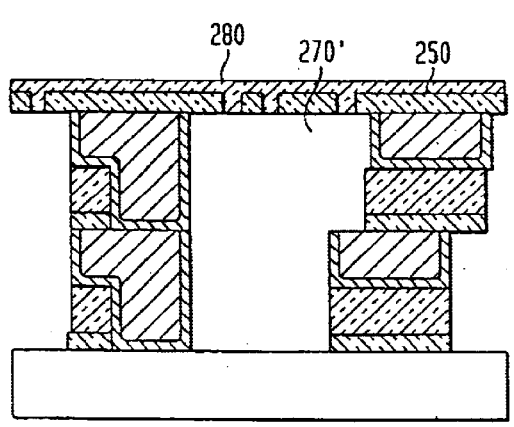
Figure 1P:
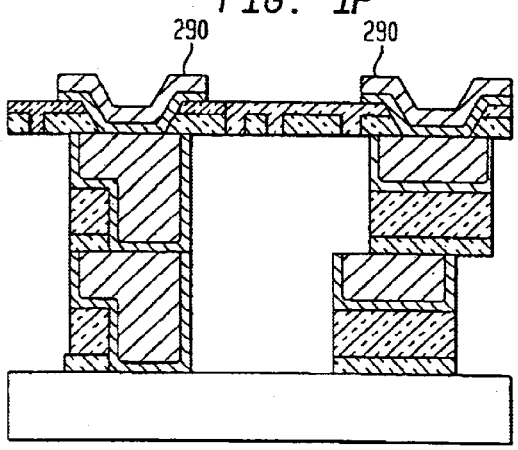

Reference is first made to FIGS. 1A–1P which show, in cross section view, the basic steps of the instant invention for forming an air-gap containing interconnect structure. Specifically, FIG. 1A comprises substrate 100 (which would normally comprise devices interspersed with conductive regions and insulating regions) after the application of optional dielectric etch stop/barrier/adhesion layer 110 and dielectric layer 120 having a combined thickness approximately equal to the desired via level thickness. FIG. 1B shows the structure after deposition of an optional dielectric etch stop/barrier/adhesion layer 130, and line level dielectric 140. Line level dielectric 140 has a thickness approximately equal to the desired line level thickness.

The various solid dielectrics in the via and line levels, including dielectrics 110, 120, 130, and 140, may be selected from the group consisting of silicon-containing materials such as amorphous hydrogenated silicon (a-Si:H), $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers;

organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, a-C:H) with or without one or more additives selected from the group containing F, N, O, Si, Ge, metals and nonmetals. Additional choices for one or more of the solid via and line level dielectrics include: any of the aforementioned materials in porous form, or in a form that changes during processing to or from being porous and/or permeable to being non-porous and/or non-permeable. Dielectric layers 110–140 may also be mixtures, multilayers, or layered combinations of the aforementioned materials.

Dielectric layers 110–140 may be formed sequentially, or all at once; they may be of the same material, of different materials: or some of the dielectric layers may be the same and some different. The dielectrics may be formed by various methods well known to those skilled in the art, including, but not limited to: spinning from solution, spraying from solution, chemical vapor deposition (CVD), plasma enhanced CVD (PECVD), sputter deposition, reactive sputter deposition, ion-beam deposition, and evaporation.

FIG. 1C shows the structure of FIG. 1B after dielectric layers 110–140 have been patterned to form via cavities 150 and line cavities 160. Masking layers used to define cavities 150 and 160 are not shown in FIG. 1C. The masking layers may be removed immediately after cavity formation, or at a time further along in the process (for example, if they are needed as a polish stop layer.) For clarity, optional dielectric layer 130 is not shown, and it is omitted from the remaining FIGS. 1D–1P. Cavities 150 and 160 are then lined with a conductive diffusion barrier material 170 and thereafter the cavities are overfilled with a conductive wiring/via material 180, which may be the same or different from conductive material 170. The overfill is next removed by a conventional planarization process such as chemical-mechanical polishing (CMP) to provide the planar structure of FIG. 1E which includes conductive vias 182 and conductive lines 185.

The conductive wiring is typically formed from the following metals or their alloys: Al, Cu, Au, Ag, W, Al—Cu, Cu—Al, Cu—Sn, Cu—Mg, and CuSi. The conductive diffusion barriers are typically composed of one or more layers selected from the group of: metals including W; metal nitrides including WN, WSiN, TaN, TiN, TaAlN, TiAlN; metal silicides; alloys, mixtures and multilayers of the aforementioned materials. The conductive materials may be formed by various methods well known to those skilled in the art, including, but not limited to: spinning from solution, spraying from solution, chemical vapor deposition, ion beam deposition, electroless or electrolytic plating, atomic layer deposition, and evaporation.

FIG. 1F shows the structure of FIG. 1E after an etchback process has been performed to remove dielectrics 110–140 from regions not shadowed by conductive wiring structures 185, leaving cavity 190 and dielectrics 110 and 120 as dielectric line supports 200. The etchback is preferably performed with an anisotropic etch process, with the conductive wiring structures 185 used as a mask. Etchback may also be performed by etching processes that have both anisotropic and isotropic components, with the degree of isotropic component determined by how much undercut is desired in dielectric line supports 200. Etchback methods may include any etching processes known to those skilled in the art, such as reactive-ion etching (RIE), plasma etching, etc, and less preferably, more isotropic processes such as ashing and wet etching.

Barrier materials 170 are preferably resistant to the reactive species used in the etchback step. For example, Co-based, Ni-based, or Al-based barriers might be preferable to Ta-based barriers if F-based reactive-ion etching is being used to remove a Si-containing permanent dielectric such as $SiO_2$ or SiCOH. The conductive barrier materials are also preferably resistant to the reaction chemistry subsequently used to extract the SPH (for example $O_2$, $H_2$, or $H_2/O_2$ mixtures with heat and/or plasma).

If damage to the conductive barrier materials cannot be avoided, it should be noted that the barrier repair may be possible by selectively depositing an electroless metal barrier material such as Ni—P, Co—W—P, Co—P, or Co—Sn—P on exposed wiring surfaces. Even if no damage to the conductive barrier is expected, such a step may be desirable in order to protect the top surface of the underlying level's wiring, which would have been exposed during etchback of the permanent dielectric. A selective electroless metal cap could also be applied to the exposed wiring surfaces shown in FIG. 1E, prior to etchback of the permanent dielectric.

FIG. 1G shows the structure of FIG. 1F modified by the presence of optional dielectric sidewall spacers 210, which may serve several key functions. First, the optional spacers provide a mechanical constraint of the conductor against electromigration-driven mass transport of conductive material out of the wiring structures. This helps prevent 'opens' caused by diffusion of wiring material out of the original wiring to leave a cavity, and 'shorts' caused by the build-up of wiring material outside the original wiring from exposure to gaseous environmental contaminants in the air gap (such as oxygen), and blocks possible migration pathways for atoms of wiring material which might otherwise find their way to the semiconductor substrate. However, it should be noted that these optional spacers do come at the cost of a higher $K_{eff}$ for the structure, and additional process steps.

Dielectric sidewall spacers and dielectric barrier materials are preferably formed from low-k materials, such as $SiO_2$, Si:C:H (bloK), SiCOH, silsesquioxane-based materials, and $SiN_x$. However, any of the materials and deposition processes listed as possibilities for dielectrics 110–140 may also be employed. Preferred process sequence for forming these dielectric sidewall spacers will be discussed later.

After formation of optional sidewall spacers 210, the structure is overfilled with a sacrificial place-holder (SPH) material 220 to form the structure of FIG. 1H. SPH material 220 is preferable thermally stable enough to survive the remaining materials deposition steps, and preferably amenable to extraction methods which selectively remove the SPH without damage to the components that are to remain in the structures. It is additionally preferred that the SPH be a material that "gap fills" in a way that does not leave cavities that will be opened when the SPH is planarized to produce the structure of FIG. 1I. SPH planarization may be performed by processes such as-chemical-mechanical polishing (CMP) or by application of a planarizing dielectric followed by RIE. Preferred materials for SPH material 220 will be discussed in connection with preferred extraction processes.

FIG. 1J shows the structure of FIG. 1I after the steps of FIGS. 1A–1E are repeated to form the conductive features 182' and 185' of the next via and line level embedded in permanent dielectric layers 110', 120' and 140' analogous to dielectrics 110–140. Again, the structure is shown without optional dielectric layer 130. The steps of FIGS. 1F–1G are then repeated to form the structure of FIG. 1K with dielectric line supports 200', and the steps of FIGS. 1H and 1I are repeated to form the structure of FIG. 1L. After forming the desired number of wiring and via levels having the form of those shown in FIG. 1L (i.e., patterned conductors embedded in a dielectric matrix comprising permanent dielectric materials and SPH materials) by the process steps just described, dielectric bridge layer 250 is formed and patterned with small openings (holes or perforations) 260 to produce the structure of FIG. 1M.

Dielectric bridge layer 250 is preferable formed from one or more layers of one or more low-k materials, for example, single layers of $SiO_2$, a-Si:C:H; trilayers comprising a top layer of $SiN_x$ or a-Si:C:H over a middle layer of $SiO_2$ over a bottom layer of $SiN_x$ or a-Si:C:H. However, any of the materials and deposition processes listed as possibilities for dielectrics 110–140 may be used.

Dielectric bridge layer 250 may be patterned to form holes 260 by any method known in the art; one preferred method would be reactive-ion etching (RIE) through a lithographically defined patterned masking layer designed to optimize the areal density, diameter, and placement of holes 260. Holes 260 preferably terminate on SPH material 220' rather than conductive features 185'. Holes 260 may be closely spaced in areas where a high density of conductive features makes it important to remove as much of the SPH as possible, whereas holes 260 may be sparsely spaced or absent in areas where it may be desirable to leave SPH in the structure to support the bridge layer. If dielectric bridge layer 250 is sufficiently porous, lithographically defined holes or perforations might not be required, as will be discussed later.

Patterned masking layers including such layers as photoresists, antireflection coatings, and/or hard masks (e.g., $SiN_x$ or a-Si:C:H) may be removed immediately after patterning bridge layer 250, or during or after the SPH extraction process described below.

SPH material 220' and 220 in FIG. 1M is then extracted to form the structure of FIG. 1N, with air gaps 270. Extraction methods include thermal decomposition (with or without reactive gases); ashing, plasma, and/or reactiveion etching, with or without heat, in mixtures that may include H, $H_2$, O, $O_2$, N, $N_2$, F, $CF_4$, other halogen-containing gases, other halocarbons, and/or Ar; wet etching methods; vapor HF; supercritical fluid (SCF) (e.g., $CO_2$), with or without additives or cosolvents; laser assisted etching including laser irradiation and ablation; microwave-mediated decomposition and removal.

In contrast to the preferably anisotropic etch process used to remove exposed portions of dielectrics 110–140, at least some component of the extraction process should be fairly isotropic. It is important that the extraction method be selective, that is the SPH can be removed without damaging (or removing) the bridge layer, the permanent (via-level) dielectric, or the conductive wiring. Possible pairs of SPH/permanent dielectrics include organics/$SiO_2$, where the organics might be materials like SiLK™ (porous or not), polyimide, amorphous carbon (a-C:H) with or without additives, low thermal stability materials such poly (methylmethacrylate) (PMMA), poly-para-xylylene (Parylene™), and norborene-based materials such as BF Goodrich's Unity Sacrificial Polymer™, or any of the other materials listed as possibilities for dielectrics 110–140. Other SPH/permanent dielectric combinations might comprise non-Si-containing materials as the permanent dielectric, where both sets of materials might be selected from the materials as the permanent dielectric, 110–140. SPH materials 220' and 220 are not required to be low-k, or even dielectric. However, the SPH material is preferably dielectric and low-k so that any SPH residuals left after the extraction process will not short out the interconnect structure, or add significant capacitance.

Finally, dielectric bridge layer 250 is sealed. Holes or perforations 260 may-be filled in, or "pinched-off" by various deposition processes to form enclosed air gap 270'. If desired, the material deposited in the pinch-off step may be planarized by a process such as chemical-mechanical polishing, or by application of a planarizing dielectric followed by RIE. Pinched-off bridge layer 250/280 is then opened in selected places for additional contacts 290, to produce the structure of FIG. 1P. Note that the contents of enclosed air gap 270' may comprise Ar, $O_2$, $N_2$, He, $CO_2$, $SF_6$, $CF_4$, other gases, vacuum, or mixtures thereof.

Figure 2A:
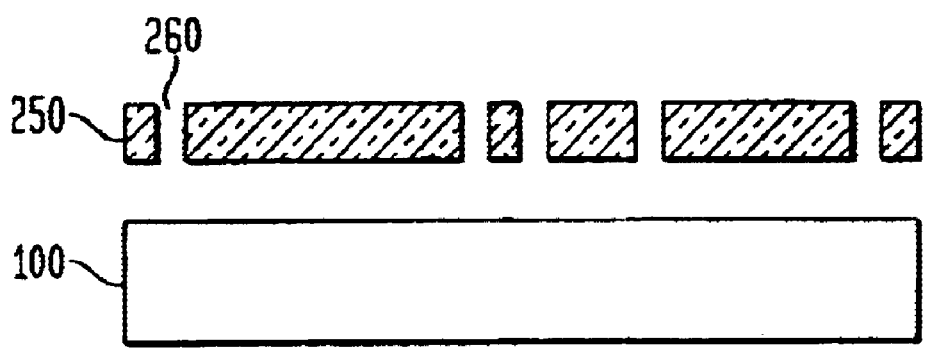
FIGS. 2A–2B show a pictorial view of a perforated dielectric bridge layer before (A) and after (B) a perforation pinch-off process.
Figure 2B:
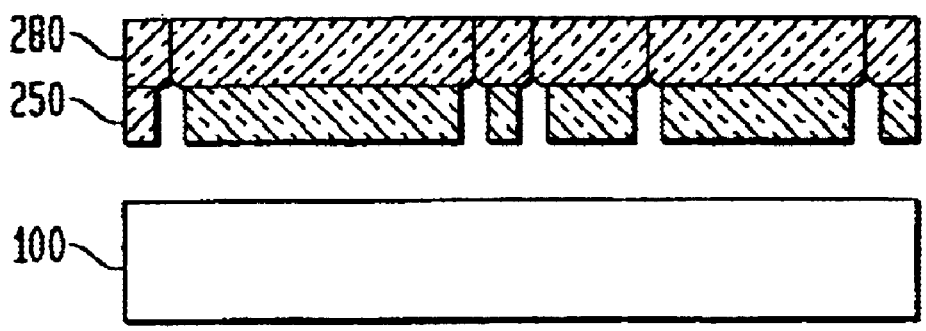

A preferred pinch-off process might comprise the deposition of a 1 μm thick PECVD $SiO_2$ layer onto a 1 μm thick PECVD $SiO_2$ dielectric bridge layer pre-patterned with 0.2 μm diameter holes or perforations. FIGS. 2A–2B show pictorial views of such a perforated bridge layer, before (FIG. 2A) and after (FIG. 2B) the preferred perforation pinch-off process just described.

Perforations 260 may alternatively be sealed off by methods that do not require the deposition of a separate pinch-off layer. For example, perforations 260 may be induced to self-seal during the application of heat, immersion in plasma, e-beam irradiation, UV irradiation, and/or laser irradiation. Alternatively, pinch-off layer 280 may be disposed in a selective manner so that the material of pinch-off layer 280 preferentially plugs perforations 260 rather than accumulating over bridge layer 250.

Figure 3A:
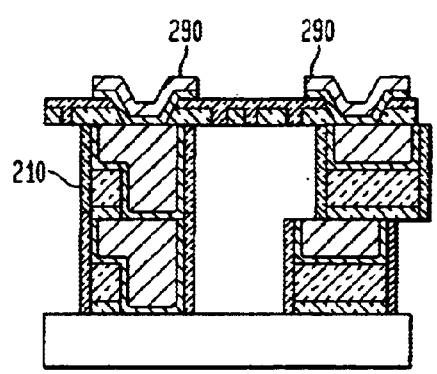
FIGS. 3A–3E show, in cross section view, examples of structures resulting from variations in the basic steps of FIGS. 1A–1P.

FIGS. 3A–3E show alternatives to the structure of FIG. 1P that may be made with the methods of the present invention. For example, variations of the structure of FIG. 1P may be made with dielectric sidewall spacers incorporated into none, some or all of the interconnect structure layers, as shown in FIG. 3A for the case of a structure with sidewall spacers 210 on both line levels.

Figure 3B:
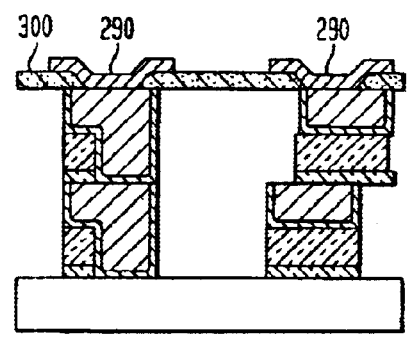
Figure 3C:
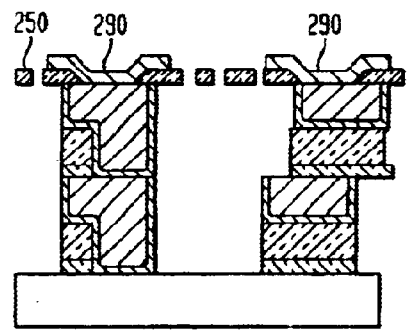

In FIG. 3B, bridge layer 250 with lithographically defined perforations is replaced by a porous bridge layer 300. After SPH extraction, the bridge 300 layer may easily be sealed with an additional layer (not shown). This approach has the advantage of bypassing both the lithography steps needed for forming the perforations, and the steps needed for perforation pinch-off. If environmental passivation/protection is supplied by a later step in the process, it may be possible to skip the perforation pinch-off step altogether, as shown in FIG. 3C.

Figure 3D:
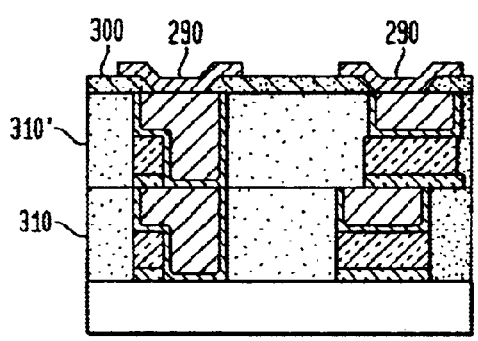
Figure 3E:
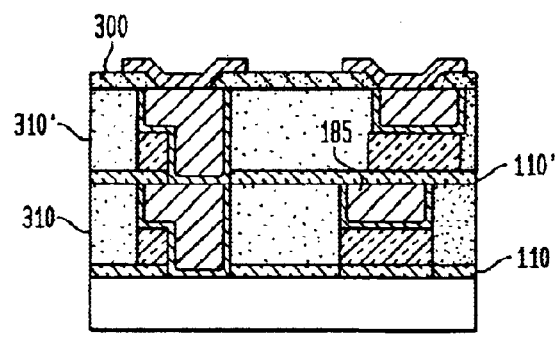

FIGS. 3D and 3E show another variation of the structure of FIG. 1P. Here, the SPH material is replaced at each level by an ultra low-k dielectric 310 and 310' which remains in the final structure. In the structure of FIG. 3D, dielectric etch stop/barrier/adhesion layers 110 and 110' are removed from regions not shadowed by conductive wiring structures 185, whereas layer 110 and 110' remain in the structure of FIG. 3E. For reasons discussed below (in connection with FIG. 4A), the structure of FIG. 3E is preferred over the structure of FIG. 3D because the extra portions of barrier dielectric 110' in structure of FIG. 3E prevent wiring material 185 from contacting dielectric material 310'.

Ultra low-k dielectrics 310 and 310' would typically be a porous version of any of the materials listed as possibilities for dielectrics 110–140, and are preferably thermal stable with respect to all subsequent processing. Porosity could be introduced at each level, as the structure is built, or "all-at-once," when the structure is in place. Hydrogen silsesquioxane (HSQ) is a preferred low-k porous dielectric material, as described in U.S. Pat. No. 6,030,891. Other low-k porous materials such as Dendriglass™, Nanoglass™, and other porous organo-silicate dielectrics as well as porous polymers such as P-SiLK™ may also be used.

Figure 4A:
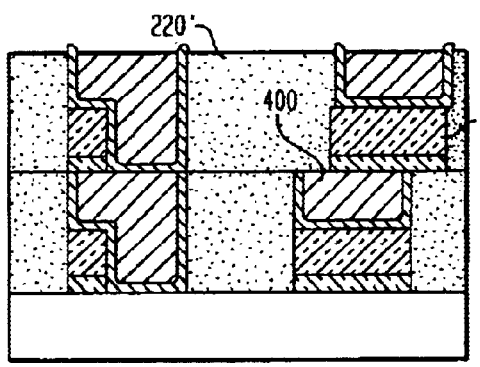
FIGS. 4A–4D show, in cross section view, additional variations of the basic method, directed towards better environmental protection for the conductive wiring and via features.
Figure 4B:
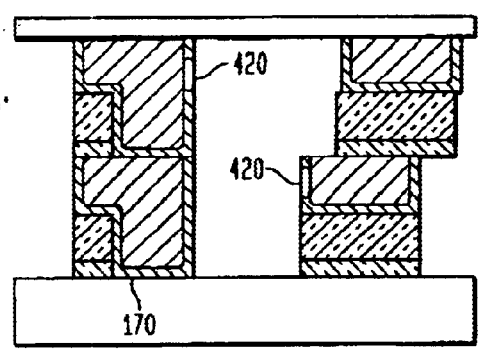

FIGS. 4A–4B highlight two potential problems with the process flow shown in FIGS. 1A–1P. FIG. 4A shows a first potential problem: wiring surfaces 400 not shadowed by the next level's wiring may be directly in contact with sacrificial dielectric 220'. Without a diffusion barrier, wiring material may diffuse through sacrificial dielectric 220' and then on into dielectric line support 200'. In addition, the lack of a barrier material leaves the conductive wiring material susceptible to oxidation damage. FIG. 4B shows another form of this problem: damage regions 420 in conductive barrier layers 170 may be formed during the permanent dielectric etching steps required to generate the structures of FIGS. 1F and 1K.

Figure 4C:
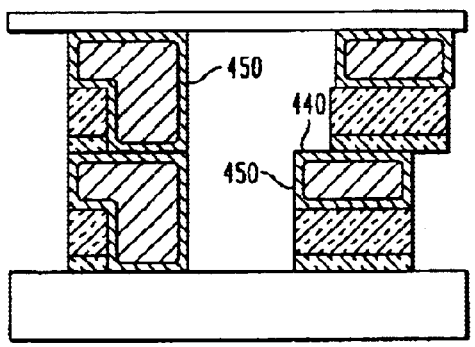

FIG. 4C shows how a selective, electroless metal (e.g., Co—P, Co—W—P, Co—Sn—P, Ni—P etc.) plating process is used to form protective coatings 440 and 450 on the exposed surfaces of the conductive wiring and vias. In preferred embodiments, coating 450 would be introduced after the dielectric etch-back steps, i.e., performed on structures corresponding to FIGS. 1F and 1K, and coating 440 would be introduced after metal planarization, i.e., performed on structures corresponding to FIGS. 1I–1L. If desired, exposed regions of coating 440 might be passivated with a thin insulator.

Figure 4D:
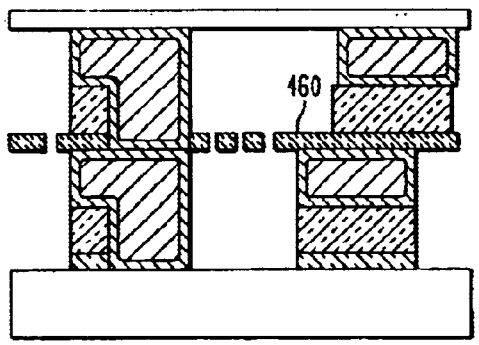

FIG. 4D shows a structure where exposed wiring surface 400 of FIG. 4A is protected by patterned dielectric layer 460 formed from dielectric barrier layer 110', or from dielectric barrier 110' in combination with additional dielectric layers. Perforation or hole patterns in patterned dielectric layer 460 may be formed after etch-back of layers 140'–120', or prior to deposition of layers 120–140'. In a preferred patterning method, layer 460 would comprise a first, lower layer and a second, upper layer. Second, upper layer would be patterned prior to application of layers 120'–140', and first, lower layer would be patterned after etch-back of layers 140'–120', using patterned second, upper layer as a mask. However, the family of methods represented by FIG. 4D are generally less preferred due to the requirements for extra lithography steps at each set of via plus wiring levels.

Figure 5A:
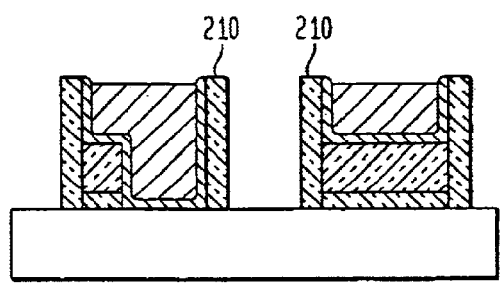
FIGS. 5A–5D show, in cross section view, possible methods for forming dielectric sidewall spacers on wiring and/or via features.
Figure 5B:
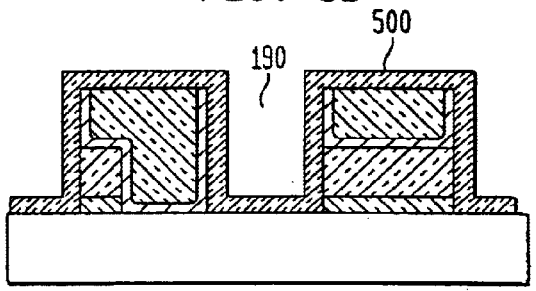

FIGS. 5A–5D pertain to process steps related to dielectric sidewall spacer formation. Dielectric sidewall spacers 210 (shown in FIGS. 1G and 5A) may be formed by any of several methods and may be incorporated at any of a variety of stages in the fabrication process. For example, as shown in FIG. 5B, spacers 210 may be formed by anisotropically etching a dielectric layer 500 deposited into cavity 190 formed after dielectric etch back step. Dielectric sidewall spacers may also be formed by a similar method prior to deposition of conductive liner 170, for example, by depositing a dielectric liner layer in the cavities 150 and 160 of the structure of FIG. 1C.

Figure 5C:
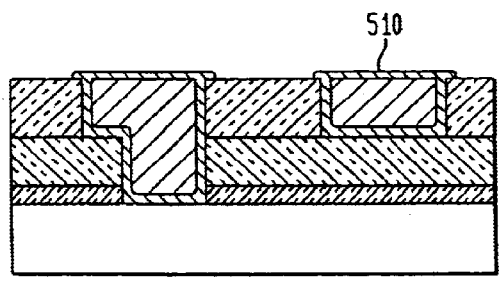
Figure 5D:
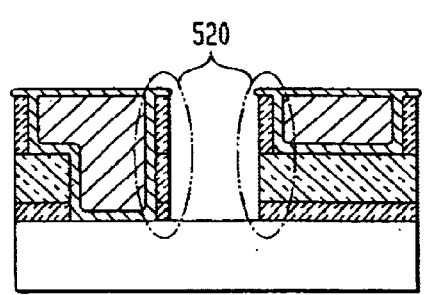

Alternatively, dielectric sidewall spacers may be formed from the permanent dielectric materials 110–140 themselves, with the use of a suitable mask. FIG. 5C shows mask 510, formed from a "mushroom" of electroless metal selectively deposited on the exposed wiring surfaces of a structure like the one of FIG. 1E. Etch-back of layers 110–140 then produces dielectric sidewall spacers 520 of FIG. 5D, leaving mask 510 which may be optionally removed (by a process such as chemical-mechanical polishing). Slightly sloped wiring profiles may be used as a mask during etching-back of layers 110–140 to produce dielectric sidewall spacers on the structure.

While the present invention has been described in an illustrative manner, it should be understood that the terminology used is intended to be in a nature of words of description rather than of limitation. Furthermore, while the present invention has been described in terms of several preferred embodiments, it is to be appreciated that those skilled in the art will readily apply these teachings to other possible variations of the inventions. In particular, while the invention has been described in detail for two dual damascene sets of "line plus via" levels, the methods of the present invention may be used to form structures containing any number of interconnect wiring levels, some or all formed by the methods of the present invention. In addition, while the invention has been described for the case where a dual damascene line plus via level set comprises the first (bottom-most) part of an interconnect structure formed on a substrate, suitable contacts in the substrate may allow this first part of the interconnect structure to be replaced by a single line level with no underlying vias. The conductive features of this line level may be embedded in either a permanent dielectric which remains in the structure, a permanent dielectric which is at least partially removed in the next level's etch back step, or in a SPH material which is removed at a later time. If this line level is formed (as preferred) with a single damascene process, the conductive features may be built in a permanent dielectric which is etched back and then filled with SPH, or directly in a SPH material (to save the steps of etchback and refill).

We claim:

1. A multilevel air-gap-containing interconnect structure comprising:
    (a) a collection of interspersed line levels and via levels, said via levels containing conductive vias and a combination air-gap plus solid via-level dielectric with one or more solid dielectrics only in shadows of the next level's conductive lines, said line levels containing conductive lines and a mostly air-gap dielectric, wherein said conductive vias are in electrical contact with said conductive lines throughout said multilevel air-gap-containing interconnect structure; and
    (b) a solid dielectric bridge layer containing conductive contacts, said bridge layer disposed over said collection of interspersed line and via levels.

2. The structure of claim 1 further including dielectric sidewall spacers on some or all of the conductive features.

3. The structure of claim 1 further comprising at least one perforated dielectric adhesion/barrier layer disposed at an interface between a lower line level and its overlying via level, said perforated dielectric adhesion/barrier layer extending beyond any shadow of the next most overlying line level.

4. The structure of claim 1 wherein the air gaps are replaced by an ultra low-k porous dielectric.

5. The structure of claim 1 wherein the air gaps are replaced by layers of an ultra low-k dielectric and layers of a residual portion of a via level dielectric, said layers of the residual portion of the via level dielectric are positioned so as to separate adjacent layers of the ultra low-k porous dielectric from each other and from exposed wiring surfaces and to prevent exposed wiring surfaces on a given wiring level from contacting a layer of ultra low-k dielectric immediately above said wiring level.

6. The structure of claim 1 wherein said bridge layer comprises a layer of a first material containing throughholes, and a layer of a second material that overfills and pinches off the holes.

7. The structure of claim 1 wherein said solid dielectrics comprise mixtures, multilayers, or layered compositions of a material selected from the group consisting of silicon containing materials; silicon containing materials that include Ge; Ge containing materials; inorganic oxides; inorganic polymers; organic polymers; carbon containing materials; organo-inorganic materials; diamond like carbon; and diamond like carbon that includes one or more additives selected from the group consisting of F, N, O, Si, Ge, metals and nonmetals.

8. The structure of claim 7 wherein said solid dielectrics are non-porous, non-permeable or a combination of non-porous and non-permeable.

9. The structure of claim 4 wherein said ultra low-k porous dielectric comprises porous silicon-containing materials; silicon containing materials that include Ge; Ge containing materials; inorganic oxides, inorganic polymers; organic polymers carbon containing materials; organo-inorganic materials; diamond like carbon; or diamond like carbon that includes one or more additives selected from the group consisting of F, N, O, Si, Ge, metals and nonmetals.

10. The structure of claim 4 wherein said ultra low-k porous dielectric comprises hydrogen silsesquioxane (HSQ).

11. The structure of claim 4 wherein said ultra low-k porous dielectric comprises porous SiCOH.

12. The structure of claim 1 wherein said conductive via and said conductive line comprise materials selected from the group consisting of Al, Cu, Au, Ag, W, Ta, Pd, Al—Cu, Cu—Al, Cu—In, Cu—Sn, Cu—Mg, Cu—Si, Ni, Co, Co—P, Co—W—P, and Ni—P.

* * * * *